(12) United States Patent
Fraisse et al.

(10) Patent No.: US 10,021,482 B2
(45) Date of Patent: Jul. 10, 2018

(54) AUDIO SPEAKER PROTECTION SYSTEM AND METHOD

(71) Applicant: STMicroelectronics (Alps) SAS, Grenoble (FR)

(72) Inventors: Christian Fraisse, Grenoble (FR); Angelo Nagari, Grenoble (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 15/598,100

(22) Filed: May 17, 2017

(65) Prior Publication Data

US 2017/0257701 A1 Sep. 7, 2017

Related U.S. Application Data

(63) Continuation of application No. 14/838,437, filed on Aug. 28, 2015, now Pat. No. 9,693,138.

(30) Foreign Application Priority Data

Dec. 19, 2014 (FR) ..................... 14 62870

(51) Int. Cl.
*H04R 3/00* (2006.01)
*H03F 3/181* (2006.01)

(52) U.S. Cl.
CPC .............. *H04R 3/007* (2013.01); *H03F 3/181* (2013.01)

(58) Field of Classification Search
None
See application file for complete search history.

(56) References Cited

U.S. PATENT DOCUMENTS

| 6,580,318 B2 | 6/2003 | Taylor |
| 8,019,292 B2 | 9/2011 | Magoon et al. |
| 8,538,040 B2 | 9/2013 | Kim |
| 8,817,995 B2 | 8/2014 | Huijser et al. |
| 9,185,493 B2 | 11/2015 | Lubberhuizen et al. |
| 9,225,301 B2 | 12/2015 | Fay |
| 9,226,071 B2 | 12/2015 | Polleros |
| 2003/0122605 A1 | 7/2003 | Ulrick et al. |

(Continued)

FOREIGN PATENT DOCUMENTS

| EP | 2538555 | 12/2012 |
| EP | 2712209 | 3/2014 |
| WO | 2008092111 | 7/2008 |

OTHER PUBLICATIONS

Berkhout et al., "A 4O 2.65W Class-D Audio Amplifier With Embedded DC-DC Boost Converter, Current Sensing ADC and DSP for Adaptive Speaker Protection", IEEE Journal of Solid-State Circuits, vol. 48 , No. 12, Dec. 2013, pp. 2952-2961.

(Continued)

*Primary Examiner* — Paul Huber
(74) *Attorney, Agent, or Firm* — Slater Matsil, LLP

(57) ABSTRACT

An audio device includes an audio amplifier configured to receive an input signal and generate a differential output signal. A first signal combiner circuit is configured to generate a time-convolution signal of an analog current signal and an analog voltage signal. The analog current signal corresponds to a current at the differential output signal, and the analog voltage signal corresponds to a voltage across the differential output signal. A second signal combiner circuit is configured to subtract the generated time-convolution signal from the input signal.

23 Claims, 4 Drawing Sheets

(56) References Cited

U.S. PATENT DOCUMENTS

2004/0178852 A1  9/2004  Neunaber
2013/0077796 A1  3/2013  Risbo et al.

OTHER PUBLICATIONS

Nagari et al. "An 8 2.5 W 1%-THD 10 4 dB(A)-Dynamic-Range Class-D Audio Amplifier With Ultra-Low EMI System and Current Sensing for Speaker Protection", IEEE Journal of Solid-State Circuits, vol. 47, No. 12, Dec. 2012.
"STA4901/STAV2001: 3-W class-D amplifier with PDM input and adaptive loudspeaker protection," Oct. 2012: 36 pages, www.stericsson.com.
TFA9887: Audio system with adaptive sound maximizer and speaker protection: NXP product short data sheetl rev. Jul. 1-11, 2012: 20 pages, http://www.nxp.com.

AUDIO SPEAKER PROTECTION SYSTEM AND METHOD

CROSS-REFERENCE TO RELATED APPLICATIONS

This application is a continuation of U.S. patent application Ser. No. 14/838,437, filed on Aug. 28, 2015 (now U.S. Pat. No. 9,693,138), which claims priority to French Patent Application No. 1462870, filed on Dec. 19, 2014, which applications are hereby incorporated herein by reference.

TECHNICAL FIELD

The present disclosure relates to the field of protection systems and methods for audio speakers, and in particular to a circuit and method for protecting an audio speaker from undesirable oscillations and overheating.

BACKGROUND

Mobile devices such as mobile telephones, and in particular smartphones, are being equipped more and more with relatively high-power audio amplifiers to drive hands free speakers and provide high-quality audio functionality. One implementation uses a class-AB amplifier as the audio amplifier. However, the efficiency of such an amplifier does not generally exceed 20-25% in most practical situations, leading to high current consumption, which is undesirable. Class-D amplifiers offer an alternative approach with a significantly higher efficiency than class-AB amplifiers.

One difficulty is that the micro speakers that are generally used in mobile devices are relatively fragile and may be easily damaged. A typical micro speaker may generally handle less than half a watt of continuous power. Indeed, micro speakers generally suffer from two main operating limitations.

First, there is a limit in the extent of excursion or movement of the speaker membrane that can occur without damaging the membrane. For a typical micro speaker, the maximum allowable excursion is around 0.4 mm. However, speakers generally have a mechanical resonance frequency at around 1 kHz, and at this frequency, the excursion limit of the speaker may be exceeded by a relatively low power signal. While a high-pass filter may be used to attenuate the signal energy at and below this resonance frequency, this would have a detrimental effect on sound quality. Furthermore, the mechanical resonance frequency may change significantly under varying operating conditions, e.g., depending on temperature, age and the external forces such as the blocking of the speaker port, meaning that a filter would have to suppress a relatively large frequency band.

Secondly, overheating can damage the speaker. Overheating occurs when more power is supplied to the speaker than can be dissipated. If, for example, air movement around the speaker is restricted by a blocked speaker port, cooling of the speaker becomes less efficient, and overheating may occur at relatively low power within a few seconds.

Existing approaches for protecting micro speakers from damage tend to be inadequate and/or complex. There is thus a need in the art for an improved speaker protection system and method.

SUMMARY

It is a goal of the embodiments of the present disclosure to at least partially address one or more of the above-described needs.

According to one aspect, a circuit may include an audio amplifier adapted or configured to amplify an input signal to generate an output signal suitable for driving a loud speaker. A first circuit may be adapted to generate a first analog signal based upon a current level drawn by the loud speaker, and a second circuit may be adapted to generate a second analog signal based on a voltage supplied across the loud speaker. A third circuit may be adapted to generate a third analog signal based on the difference between the first and second analog signals, and modify the input signal based on the third analog signal.

According to one example embodiment, at least one of the first and second analog signals may be normalized with respect to the other. Furthermore, the second circuit may include an analog filter adapted to shift the phase of the output signal to generate the second analog signal. The input signal may be modified by subtracting the third analog signal from the input signal.

According to another example, the circuit may further include a compressor adapted to partially compress the third analog signal prior to its subtraction from the input signal. Moreover, the compressor may be adapted to render the third analog signal null when the first analog signal is greater than the second analog signal. Additionally, the compressor may include at least one variable resistor in a conduction path of the third analog signal, with the resistance of the at least one variable resistor being selected iteratively based on the difference. In accordance with one example, the audio amplifier may be a class D audio amplifier.

A related system may include a loud speaker, a processing device adapted to generate a digital audio stream, a digital-to-analog converter adapted to generate the input signal based on the digital audio stream, and the above-described circuit adapted to drive the loud speaker based on the input signal. A related method may include amplifying, by an audio amplifier, an input signal to generate an output signal suitable for driving a loud speaker. The method may further include generating, by a first circuit, a first analog signal based on a current level drawn by the loud speaker, and generating, by a second circuit, a second analog signal based on a voltage supplied across the loud speaker. At least one of the first and second analog signals may be normalized with respect to the other. The method may also include generating, by a third circuit, a third analog signal based upon the difference between the first and second analog signals and modifying, by the third circuit, the input signal based upon the third analog signal.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF ILLUSTRATIVE EMBODIMENTS

Throughout the present description, the term "connected" is used to designate a direct connection between two elements, whereas the term "coupled" is used to designate a connection between two elements that may be direct, or may be via one or more other components such as resistors, capacitors or transistors.

The publication by A. Nagari et al. entitled "An 8Ω 2.5 W 1%-THD 10 4 dB(A)-Dynamic-Range Class-D Audio Amplifier With Ultra-Low EMI System and Current Sensing for Speaker Protection", IEEE Journal of Solid-State Circuits, Vol. 47, No. 12, December 2012, describes a speaker protection circuit that uses an analog-to-digital converter to convert current measurements in a speaker into digital values, and a digital signal processor (DSP) to process the digital values and adjust, in response, the digital signal supplied to the speaker. The contents of this publication are hereby incorporated herein by reference in their entirety.

While the approach described in the above-noted publication is relatively effective, the use of a DSP results in relatively high power consumption, consumes a relatively high surface area, and adds complexity. Furthermore, the concatenation of the DSP software for providing speaker protection with vendor specific software for performing other functions of the DSP may be a complex task.

Figure 1:
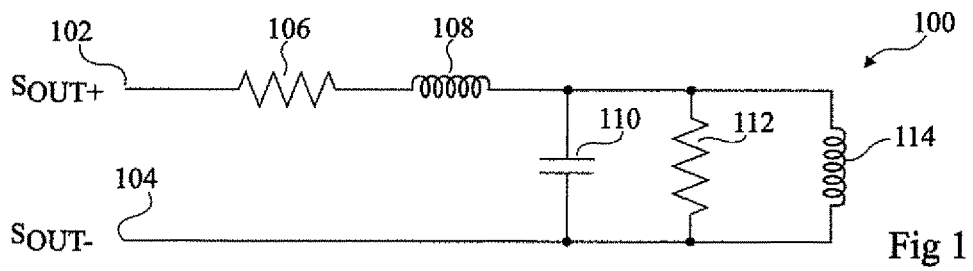
FIG. 1 is a schematic circuit diagram illustrating an electrical equivalent circuit of a loud speaker.

FIG. 1 schematically illustrates an electrical equivalent circuit 100 of a loud speaker, which is for example a micro speaker of a mobile telephone, having two input terminals 102 and 104 receiving signals $S_{OUT+}$ and $S_{OUT-}$ from an amplifier (not illustrated in FIG. 1). The circuit 100 includes a resistor 106 coupled to the terminal 102 of the loud speaker and representing an equivalent resistive load that is variable in temperature. The resistor 106 is coupled in series with an inductor 108. The loud speaker also includes a resonant part modelled by the parallel connection of a capacitor no, resistor 112 and inductor 114, each coupled between the inductor 108 and the terminal 104. The resonant part represents the resonant behavior of the loud speaker around a certain frequency, which varies with temperature and by other effects.

By way of example, assuming the loud speaker has a nominal impedance of around 8 ohms, the resistor 106 has a resistance of around 7.4 ohms, the inductor 108 has an inductance in the range 40 to 100 μH (e.g., around 60 μH), the capacitor no has a capacitance of around 160 μF, the resistor 112 has a resistance of around 16 ohms, and the inductor 114 has an inductance of around 200 μH. As used herein, the term "around" is used to designate a range of +/−10 percent. Of course, the above values are merely one example, and such a model will vary considerably from one speaker to another, depending on characteristics such as the dimensions and impedance of the speaker.

Figure 2A:
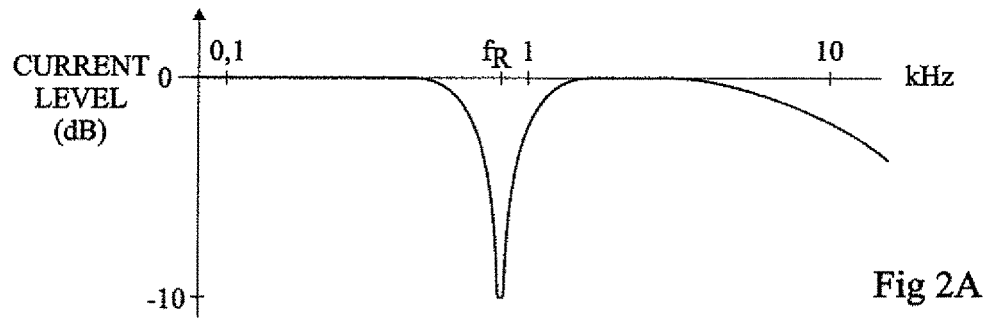
FIG. 2A is a graph illustrating an example of the typical relationship between current level and frequency in a loud speaker.

FIG. 2A illustrates an example of the relation between current level (CURRENT LEVEL), in decibels, and frequency on a log scale in kHz for the speaker represented by the model of FIG. 1. As illustrated in FIG. 2A, the current level remains constant at 0 dB for low frequencies up to close to the resonance frequency $f_R$ of the speaker, where the current level falls abruptly, for example. In the example of FIG. 2A, the resonance frequency $f_R$ is just under 1 kHz, and at this point the current reaches a low point of −10 dB, for example. Above the resonance frequency, the current level rises again to the 0 dB level before dropping off again as the frequency approaches the limit of the speaker at around 20 kHz. According to the embodiments described herein, to avoid damage to the loud speaker, the signal energy at around the resonance frequency $f_R$ may be attenuated.

Figure 2B:
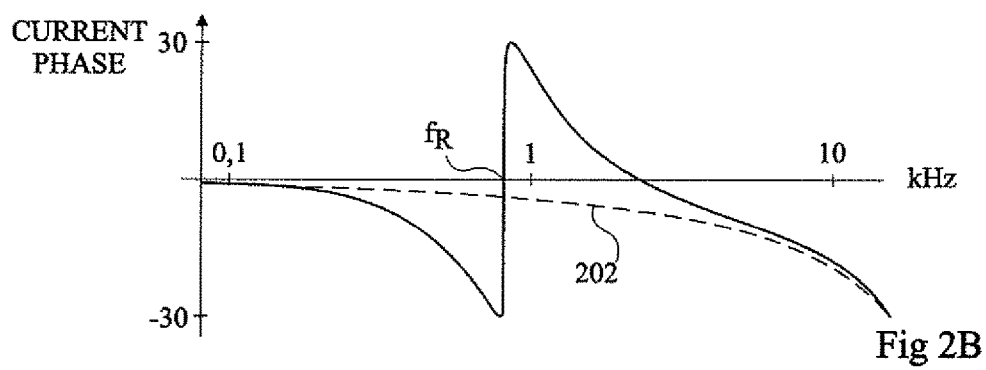
FIG. 2B is a graph illustrating an example of the typical relationship between current phase and frequency in a loud speaker.

FIG. 2B illustrates an example of the relation between the phase of the current (CURRENT PHASE), in degrees, and frequency on a log scale in kHz in the speaker represented by the model of FIG. 1. A dashed curve 202 in FIG. 2B illustrates a case in which the loud speaker does not suffer from having a resonance frequency, and in such case the phase shifts progressively with frequency, for example reaching a phase shift of −30 degrees at 20 kHz. However, as shown by a solid curve in FIG. 2B, in the case that the speaker does have a resonance frequency $f_R$, the phase shift falls rapidly close to this frequency, for example. Just lower than the resonance frequency $f_R$, the phase shift reaches a peak of around −30 degrees, and then abruptly flips to a positive phase shift at a peak of 30 degrees just above the resonance frequency $f_R$. The phase shift then falls progressively as the frequency increases it goes negative and reaches the level of −30 degrees at 20 kHz, for example.

Figure 3:
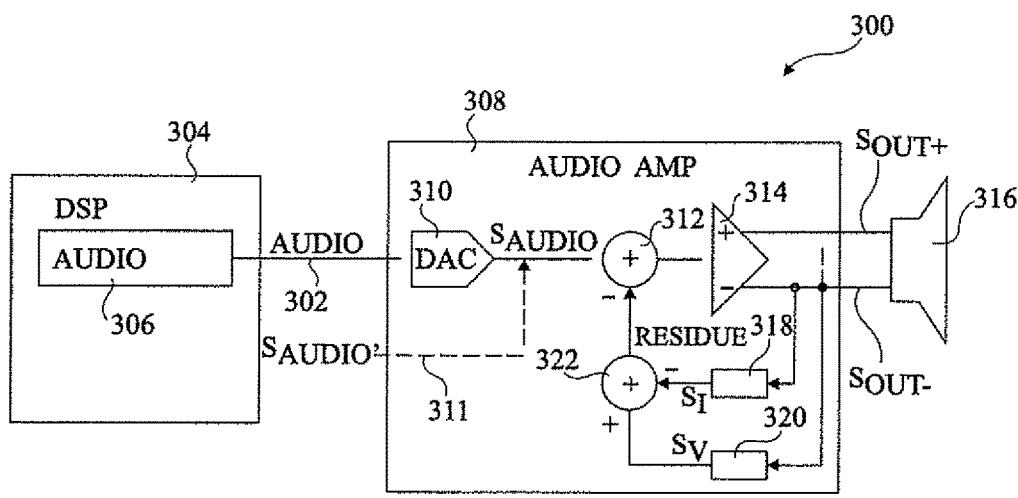
FIG. 3 is a schematic circuit diagram illustrating an audio system including a loud speaker protection system according to an example embodiment of the present disclosure.

FIG. 3 schematically illustrates an audio system 300 according to an example embodiment of the present disclosure. A digital audio signal AUDIO is provided on a connection 302 from a digital signal processor (DSP) 304, for example, based on an audio stream 306 (AUDIO) from an audio file stored in a memory (not illustrated in FIG. 3). The connection 302 is couped to an audio amplifier block (AUDIO AMP) 308, and in particular to a digital-to-analog converter (DAC) 310, which converts the signal AUDIO into an analog voltage signal $S_{AUDIO}$. In some embodiments, an analog signal $S_{AUDIO}$ may alternatively or additionally be supplied via an input 311 of the audio amplifier block 308 from an analog source.

The analog signal $S_{AUDIO}$ is provided to a power-limiting element 312, which adjusts the power of the signal provided to the loud speaker based on a feedback path described below. The feedback signal, labelled RESIDUE in FIG. 3, corresponds to the time-convolution of the speaker current $I_{SPKR}$ and voltage $V_{SPKR}$, with suitable weighting and phase adjustment, for example. In particular, the time convolution of $V_{SPKR} \cdot I_{SPKR}$ corresponds to the impedance $Z_{SPKR}$ in the frequency domain. For example, the feedback signal RESIDUE is subtracted from the signal $S_{AUDIO}$ by the element 312. This subtraction of the impedance $Z_{SPKR}$ from the signal path leads to a real-time equalization of the path, itself weighted by the frequency response of the speaker impedance.

The output of the power-limiting element 312 is provided to an audio amplifier 314, which is a class D amplifier, for example, although in alternative embodiments other types of amplifiers could be used, such as a class AB amplifier. The amplifier 314 provides the differential output signals $S_{OUT+}$, $S_{OUT-}$ to the speaker 316, which may be a micro speaker, for example.

A current measurement is taken from one of the output lines of the audio amplifier 314 and is provided to a circuit 318, which generates an analog current signal $S_I$ represented by a voltage signal, for example, based on the level of current through the speaker. Furthermore, a voltage measurement is taken across the output lines of the audio amplifier 314, and is provided to a circuit 320, which provides an analog signal $S_V$ based on the voltage difference $V_{OUT}$ between $S_{OUT+}$ and $S_{OUT-}$.

The current measurement is independent of the DC resistance of the speaker, for example. In other words, it is normalized to assume a unitary resistance. For example, in one embodiment, the current measurement is based on the voltage drop across a resistor in one of the output lines of the audio amplifier 314. This resistor has a resistance $R_{SENSE}$ equal to a fraction $G_{SENSE}$ of the DC resistance of the speaker, for example. Thus, under DC conditions, the current measurement will equal $G_{SENSE} * V_{OUT}$. Furthermore, at least one of the current and voltage signals $S_I$, $S_V$ may be normalized by the circuit 318 or 320 to cancel the gain $G_{SENSE}$ applied to the current measurement, such that under DC conditions the current and voltage signals will be substantially equal.

A difference between the current and voltage signals $S_I$, $S_V$ is then generated by a circuit 322, for example, by subtracting the current signal from the voltage signal. The result forms the signal RESIDUE to be subtracted from the input signals $S_{AUDIO}$ by the element 312.

In some embodiments, the RESIDUE signal may be generated by applying, by the circuit 322, a gain to the difference between the current and voltage signals. Furthermore, in some embodiments, the RESIDUE signal is only asserted in the case that the voltage signal $S_V$ is greater than the current signal SI, and in the alternative case, the RESIDUE signal is null.

In operation, the analog feedback loop formed by the circuits 318, 320 and 322 and the element 312 provides near instantaneous correction of the energy level of the signal if an increased impedance of the loud speaker 316 is detected. In other words, if the voltage signal $S_V$ goes higher than the current signal $S_I$.

Figure 4:
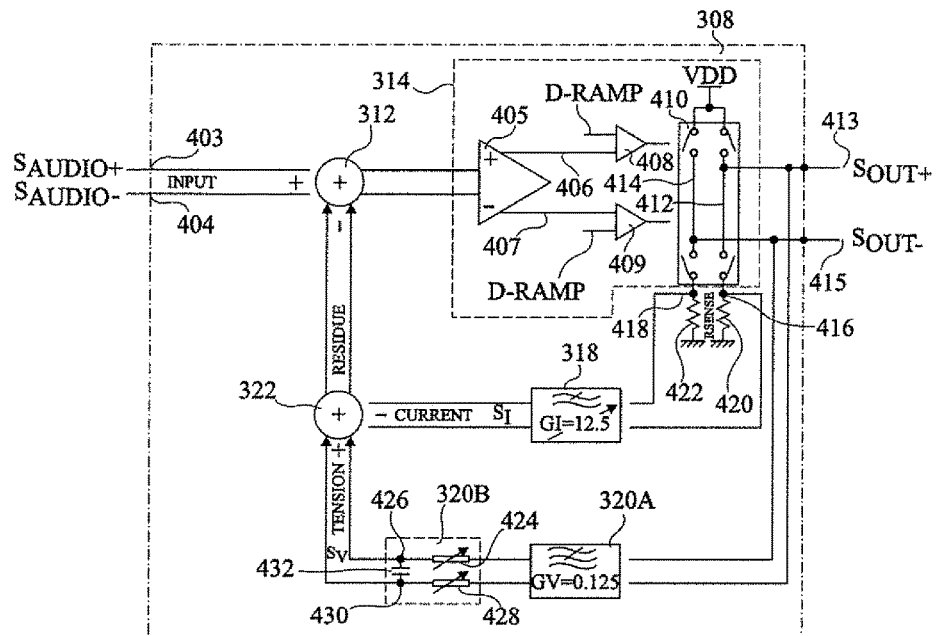
FIG. 4 is a schematic circuit diagram illustrating the amplification and protection system of FIG. 3 in more detail according to an example embodiment.

FIG. 4 schematically illustrates the audio amplifier block 308 of FIG. 3 in more detail according to an example embodiment. As shown in FIG. 4, the analog audio signal $S_{AUDIO}$ of FIG. 3 is, for example, a differential signal $S_{AUDIO+}$, $S_{AUDIO-}$ provided at corresponding input nodes 403 and 404 of the audio amplifier 314. The signal $S_{AUDIO}$ may be provided by differential outputs of the DAC 310 (not illustrated in FIG. 4), or via input lines forming the input 311 of FIG. 3 (also not illustrated in FIG. 4).

In the example of FIG. 4, the audio amplifier 314 is a class D audio amplifier including an integrator 405. A positive output 406 of the integrator 405 is coupled to one input of a comparator 408, the other input of which is coupled to receive a double ramp signal (D-RAMP). Similarly, a negative output 407 of the integrator 405 is coupled to one input of a comparator 409, the other input of which is coupled to receive the double ramp signal. The output of each of the comparators 408, 409 is coupled to an H-bridge 410.

The H-bridge 410 includes a conductor 412 coupled to an output 413 of the audio amplifier block 308, and a conductor 414 coupled to an output 415 of the audio amplifier block 308. The conductors 412 and 414 are coupled to the supply voltage $V_{DD}$ via respective switches. The conductor 412 is also coupled to a node 416 via a further switch, and the conductor 414 is also coupled to a node 418 via yet a further switch. The node 416 is coupled to ground via a resistor 420, and the node 418 is coupled to ground via a resistor 422. Each of the resistors 420, 422 has a resistance Rsense. The outputs of the comparators 408, 409 control the switches of the H-bridge such that the output 413 is coupled to the supply voltage VDD and the output 415 is coupled to ground via the resistor 422, or such that the output 413 is coupled to ground via the resistor 420 and the output 415 is coupled to the supply voltage $V_{DD}$.

The circuit 318 has inputs coupled to the nodes 416 and 418. In one embodiment, the gain GI of an amplifier stage of circuit 318 is equal to:

$$GI = G_{trim} + G_{Rdc},$$

where $G_{trim}$ is a value selected from a lookup table, for example, to compensate for any difference between each of the resistors 420 and 422 and their nominal value. $G_{Rdc}$ is a value which may be selected from a further lookup table and may be used to compensate for any difference between the actual DC resistance of the loud speaker 316 and its nominal value, for example. The circuit 318 may also include a first order filter for filtering the analog current signal. A first order filter may be sufficient because the current is also filtered by the load.

The circuit 320 for generating the analog voltage signal $S_v$ may include an amplifier stage 320A having a gain GV of around 0.125, for example. The circuit 320A also may also include a second order filter for filtering the analog voltage signal.

The circuit 320 may also include a variable RC filter 320B including a variable resistor 424 coupled between one output of the differential amplifier stage 320A and a node 426, and a variable resistor 428 coupled between the other output of the differential amplifier stage 320A and a node 430. A capacitor 432 may be coupled between the nodes 426 and 430.

The resistances of the variable resistors 424, 428 may be chosen such that the RC filter 320B compensates for the phase difference between the voltage across the output terminals 413, 415 and the current through the loud speaker 316, which may vary as a function of the inductance of the loud speaker 316. For example, calling the resistance of each of the resistors 424, 428 Rle, the value of Rle is adapted to equal:

$$Rle = Le/(40 \times 10^{-12} * Rdc),$$

where Le is the inductance of the loud speaker 316 as represented by the inductor 108 in FIG. 1, and Rdc is the DC resistance of the loud speaker 316. Taking the example that Le is equal to 60 μH and Rdc is equal to 7.4 ohms, the resistance Rle may be chosen to be 202.7 k ohms. In one embodiment, the resistors 424, 428 may each be variable around a value of around 203 k ohms, and the capacitor 465 may have a capacitance of around 20 pF, for example.

Figure 5:
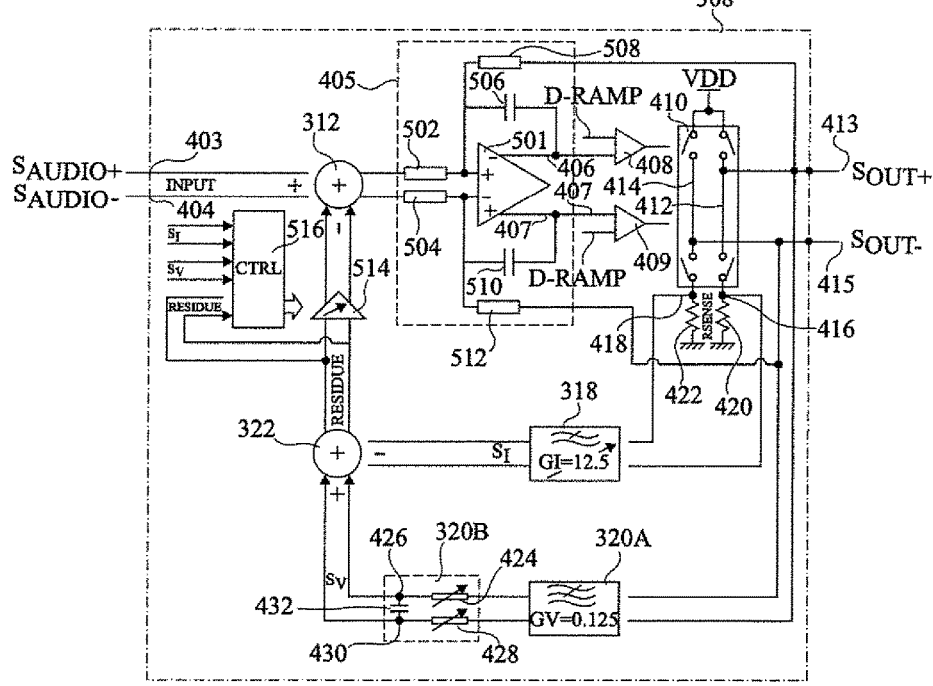
FIG. 5 a schematic circuit diagram illustrating the amplification and protection system of FIG. 3 in more detail according to a further example embodiment.

FIG. 5 schematically illustrates the audio amplifier block 308 of FIG. 3 in more detail according to an alternative embodiment to that of FIG. 4. Many of the elements of the circuit of FIG. 5 are identical to those of the circuit of FIG. 4, and have been labelled with like reference numerals and will not be described again in detail.

FIG. 5 illustrates the integrator 405 according to an example in which it includes a differential amplifier 501 having its positive input coupled to one output of the power limiting element 312 via a resistor 502, and its negative input coupled to the other output of the power limiting element 312 via a resistor 504. The differential amplifier 501 also has its positive input coupled to its negative output by a capacitor 506, and to the output node 413 of the audio amplifier block 308 via a resistor 508. Similarly, the differential amplifier has its negative input coupled to its positive output by a capacitor 510, and to the output node 415 of the audio amplifier block 308 by a resistor 512, for example.

Furthermore, in the embodiment of FIG. 5, the output lines of the circuit 322 are coupled to the power limiting element 312 via a compressor 514, which is controlled by a control block (CTRL) 516, for example. The control block 516 may select a resistance value of the compressor 514 based on the residue signal, on the analog current signal $S_I$ provided at the output of the circuit 318, and on the analog voltage signal $S_V$ provided at the output of the circuit 320, for example.

Figure 6:
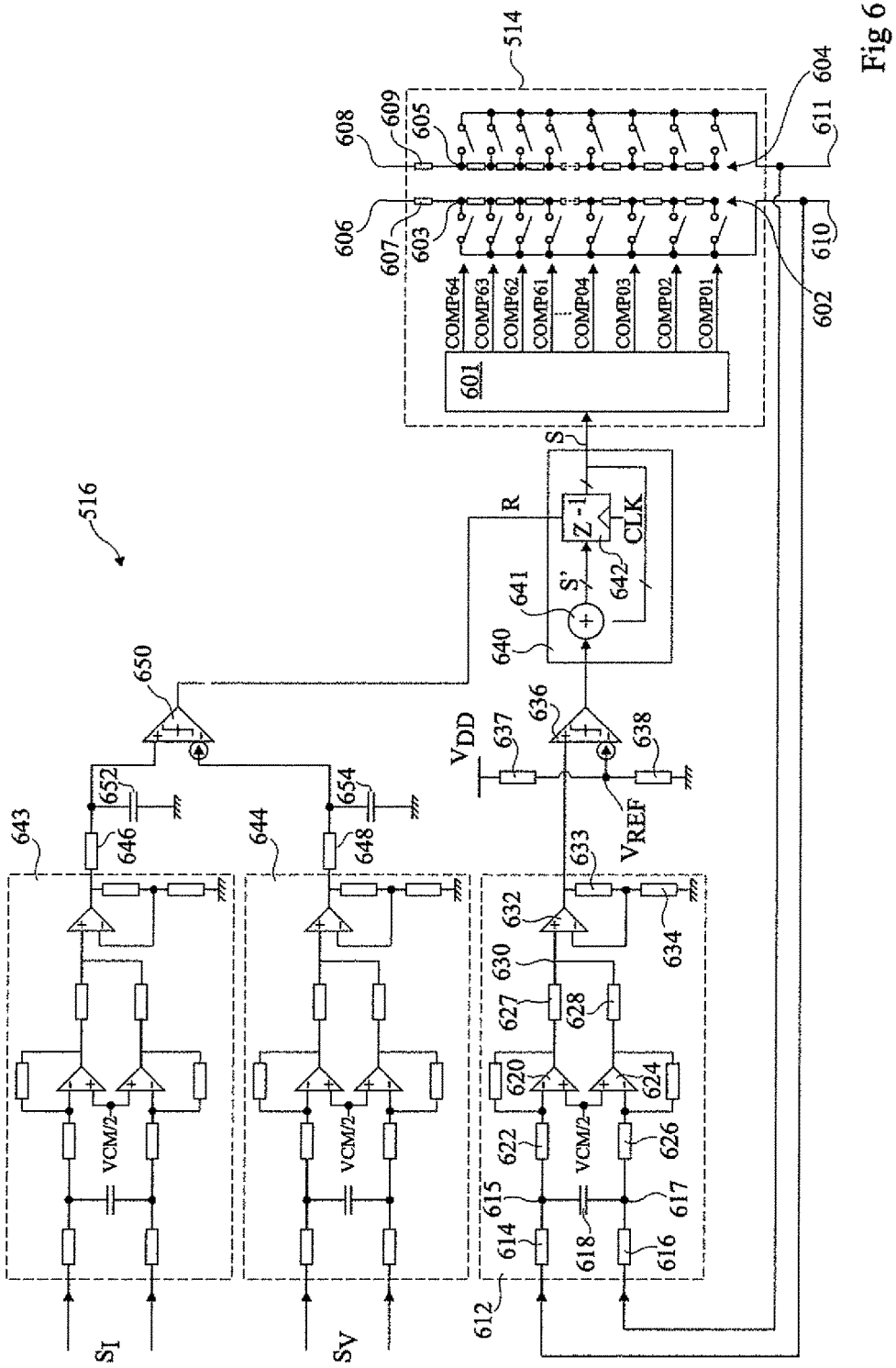
FIG. 6 a schematic circuit diagram illustrating the compressor and control circuit of FIG. 5 in more detail according to an example embodiment.

FIG. 6 schematically illustrates the compressor 514 and the control block 516 in more detail according to an example embodiment. The compressor 514 may include a selection circuit 601, and a variable resistor formed by a series 602 of 63 resistors coupled to a node 603, and a further variable resistor formed by a series 604 of 63 resistors coupled to a node 605. The node 603 is coupled to an output 606 of the compressor 514 via a resistor 607, and the node 605 is coupled to an output 608 of the compressor 514 via a resistor 609, for example. While in some embodiments the resistors of each series 602, 604 have the same resistance as each other, in the example of FIG. 6, the resistor of each series closest to the node 603, 604 has a relatively low resistance, and the resistances of the other elements rise progressively the further they are from the nodes 603, 605, for example. A node 610 at the input of the compressor 514 which is coupled to one output of the circuit 322, may be selectively coupled by one of a series of 64 switches to any node of the resistor series 602. These switches are respectively controlled by 1-bit control signals $COMP_{01}$ to $COMP_{64}$. Similarly, a node 611 at the input of the compressor 514, which is coupled to the other output of the circuit 322, may be selectively coupled by one of a series of 64 switches to any node of the resistor series 604. These switches are also respectively controlled by the control signals $COMP_1$ to $COMP_{64}$. The selection block 601 activates one of the control signals $COMP_1$ to $COMP_{64}$, or none of these signals, based on a selection signal S provided by the control circuit 516.

Figure 7:
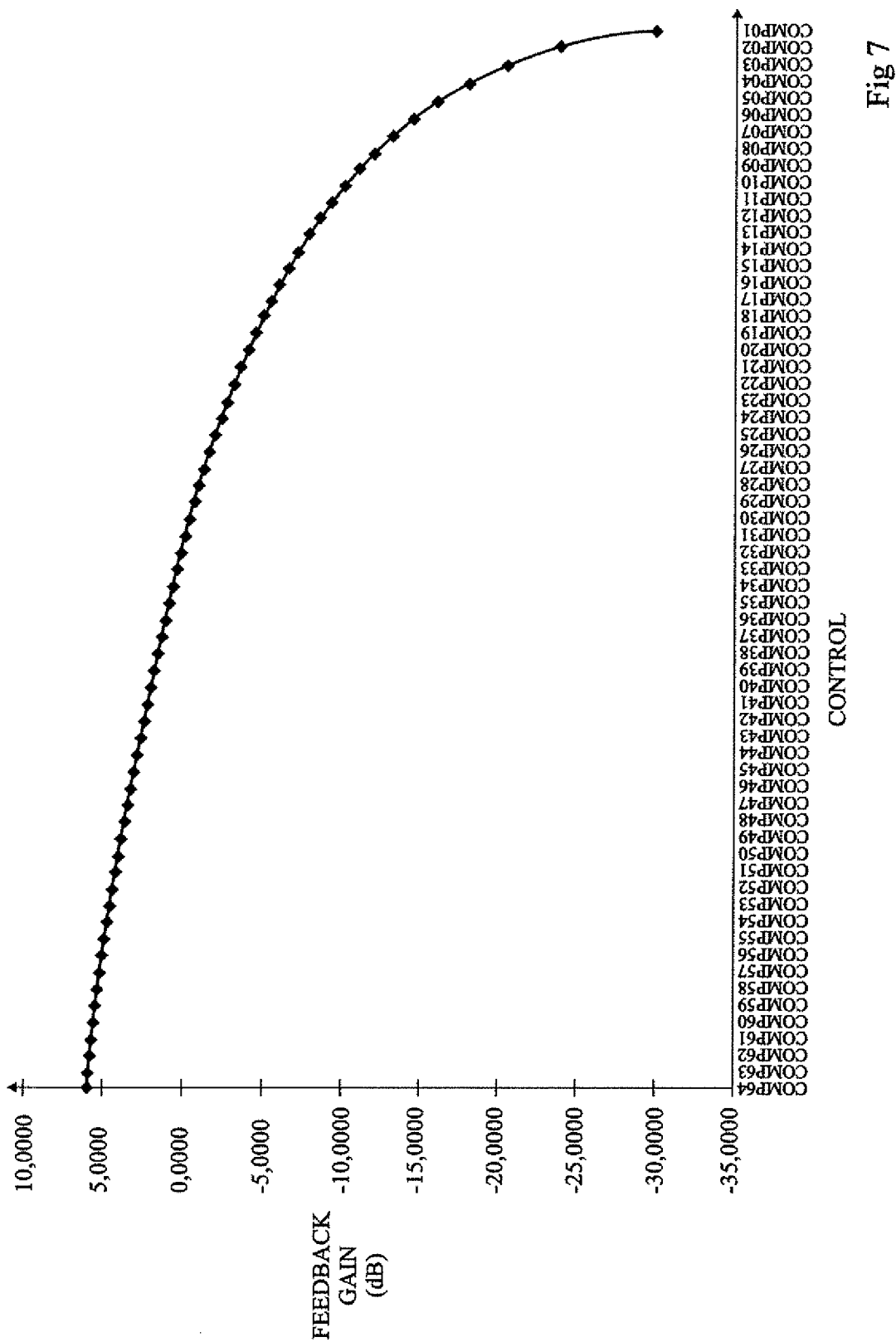
FIG. 7 is a graph representing feedback gain based on the control of the compressor of FIG. 6 according to an example embodiment.

An example of the feedback gain provided by the selection of each of the control signals is illustrated in FIG. 7. More particularly, FIG. 7 is a graph representing feedback gain (FEEDBACK GAIN) in decibels based on the control signal (CONTROL) applied to the compressor. In the case that none of the control signals $COMP_{01}$ to $COMP_{64}$ is activated, the loop is open, for example. The lowest selectable gain corresponding to the activation of the signal $COMP_{01}$ is around −32 dB, while the highest gain corresponding to the activation of the control signal $COMP_{64}$ is of around +6 dB, for example. The gain falls relatively linearly for the control signals $COMP_{64}$ to $COMP_{20}$, and then falls exponentially to the minimum value, for example. It will be apparent to those skilled in the art how the resistance values in the compressor and other resistors in the circuit may be selected to achieve the feedback gains represented in FIG. 7. Furthermore, it will be apparent to those skilled in the art how a similar compressor law, having a curve similar to that of FIG. 7, may be achieved with a greater or lower number of control signals.

With reference again to FIG. 6, the control circuit 516 may include a conversion stage 612 which receives the residue signal RESIDUE from the input nodes 610, 611, and provides differential to single-ended conversion. The stage 612 may include an RC filter formed of a resistor 614 coupling the line 610 to a node 615, a resistor 616 coupling the line 611 to a node 617, and a capacitor 618 coupled between the nodes 615 and 617. The resistors 614 and 616 may have resistances of around 400K ohms, and the capacitor 618 may have a capacitance of around 15 pF, for example. The node 615 is coupled to a negative input of a differential amplifier 620 via a resistor 622 having a resistance of around 400K ohms, for example. The differential amplifier 620 may have a feedback path between its output and its negative input including a resistor having a resistance of around 800K ohms. Similarly, the node 617 may be coupled to a negative input of a differential amplifier 624 via a resistor 626 having a resistance of around 400K ohms. The differential amplifier 624 may have a feedback path between its output and its negative input including a resistor having a resistance of around 800K ohms, for example.

The positive inputs of the differential amplifiers 620, 624 are coupled to a reference voltage level equal to around half of a common mode voltage VCM of the differential signals, for example. The outputs of the differential amplifiers 620, 624 are each coupled, via a respective resistor 627, 628, to a node 630, for example. The node 630 is coupled to a positive input of a differential amplifier 632 having its output coupled to ground by the series connection of a pair of resistors 633, 634 respectively having resistances of around 1200 and 400K ohms, for example. An intermediate node between the resistors 633 and 634 is coupled to the negative input of the differential amplifier 632. The amplifier 632 provides the absolute value, e.g., the rms (root mean square) of the differential input residue of the block 612.

The output of block 612 is coupled to the positive input of a comparator 636, which compares the signal with a reference voltage $V_{REF}$ generated by a series connection of a resistor 637 and a variable resistor 638 coupled between the supply voltage VDD and ground. In one embodiment, the supply voltage $V_{DD}$ is at around 2 V, the resistor 637 has a resistance of around 63K ohms, and the resistor 638 has a resistance of around 27K ohms, such that reference $V_{REF}$ is around 0.54 volts. The comparator 636 provides a binary value at its output, which is high if the signal from block 612 is higher than $V_{REF}$, and low if the signal from block 612 is lower than $V_{REF}$, for example.

The output of the comparator 636 is coupled to an accumulator 640, which is, for example, twelve bits. The accumulator 640 may include a 12-bit adder 641, which receives the output binary signal from the comparator 636 and adds this to the signal S at the output of the accumulator 640 to generate a modified value S' provided to a flip-flop 642. The flip-flop 642 is clocked by a clock signal CLK, which has frequency of around 48 kHz, for example. The flip-flop 642 may provide the selection signal S at its output.

In one embodiment, the selection circuit 601 generates the control signals $COMP_{01}$ to $COMP_{64}$ based on the six most significant bits (MSBs) of the 12-bit value S. For example, when the 6 MSBs are all low, none of the signals $COMP_1$ to $COMP_{64}$ is asserted, whereas when all of the 6 MSBs are all high, the signal $COMP_{64}$ is selected. The adder 641 is for example adapted to add 32 to the 12-bit value, in other words binary "0000 0010 0000", if the output of the comparator 636 is high, and to subtract 1 from the 12-bit value, in other words to subtract binary "0000 0000 0001", if the output of the comparator 636 is low.

The flip-flop 642 may be reset to zero by a reset signal R provided by a sign verification block that will now be described. This block may assert the reset signal R if the current signal $S_I$ is greater than the voltage signal $S_V$, so that the signal at the output of the compression block 508 is brought low.

The differential current signal Si may be provided to a differential to single-ended conversion block 643, which is similar to the block 612, for example, and will not be described again in detail. Similarly, the differential voltage signal $S_V$ is provided from a differential to absolute value (e.g. rms) conversion block 644, which is also similar to the block 612, for example, and will not be described again in detail. The outputs of blocks 643 and 644 are provided, via respective resistors 646 and 648, to positive and negative inputs respectively of a comparator 650. The positive and negative inputs are also respectively coupled to ground via capacitors 652 and 654 respectively, for example. The resistors 646, 648 may each have resistances of around 64000K ohms, and the capacitors 652, 654 each for example have capacitances of around 40 pF, for example. The comparator 650 may compare the input signals and assert the reset signal R if the current signal is higher than the voltage signal.

An advantage of the compression system described in FIG. 5 is that it will tend to reduce the signal-to-noise ratio in the system. This permits the amplifier 314 to be relaxed in terms of input referred noise, thereby reducing power consumption and chip area, for example.

The 6-bit control provided by the compression and control circuits 514, 516 limits the SNDR (Signal to noise+distortion ratio) to 36 dB around the resonance frequency, which corresponds to 46 dB dynamic range, which may be sufficient for providing a high Sound Pressure Level psychoacoustic mask effect. In alternative embodiments, a compression based on more or fewer bits may be applied. For example, a 7-bit compressor would provide 46 dB of SNDR, and 52 dB dynamic range.

An advantage of the embodiments described herein is that the circuit provides a simple and efficient control mechanism for protecting a speaker from damage related to overheating and/or displacement beyond its maximum safe excursion limit. The inventors have found that the implementation of such a circuit adds relatively low current consumption, and a limited additional circuit area.

While some specific embodiments of the invention have been described in detail and represented in the figures, it will be apparent to those skilled in the art that there are numerous modifications and alterations that could be applied. For example, while the figures include many examples of resistances, capacitances and inductances, it will be apparent to those skilled in the art that many different values may be used, depending on the specific application. Furthermore, it will be apparent to those skilled in the art that the embodiments described herein may be adapted to a single-ended rather than differential implementation.

What is claimed is:

1. An audio device comprising:
    an audio amplifier configured to receive an input signal and generate a differential output signal;
    a first signal combiner circuit configured to generate a time-convolution signal of an analog current signal and an analog voltage signal, wherein the analog current signal corresponds to a current at the differential output signal, and wherein the analog voltage signal corresponds to a voltage across the differential output signal; and
    a second signal combiner circuit configured to subtract the generated time-convolution signal from the input signal.

2. The audio device of claim 1, wherein the analog current signal or analog voltage signal is normalized with respect to the other analog signal.

3. The audio device of claim 1, wherein the first signal combiner circuit further comprises an analog filter configured to generate the analog voltage signal by shifting a phase of the differential output signal.

4. The audio device of claim 1, further comprising a compressor configured to at least partially compress the generated time-convolution signal prior to the generated time-convolution signal being subtracted from the input signal.

5. The audio device of claim 4, wherein the compressor is further configured to render the generated time-convolution signal null when the analog current signal is greater than the analog voltage signal.

6. The audio device of claim 4, wherein the compressor comprises a variable resistor in a conduction path of the generated time-convolution signal, and wherein a resistance of the variable resistor is iteratively changed based upon the subtraction of the generated time-convolution signal from the input signal.

7. The audio device of claim 4, further comprising a control circuit configured to convert the generated time-convolution signal from a differential signal to a single-ended signal.

8. The audio device of claim 1, wherein the audio amplifier comprises a class D audio amplifier.

9. The audio device of claim 1, further comprising:
    a loud speaker configured to receive the differential output signal; and
    a processing device configured to generate a digital audio stream.

10. The audio device of claim 9, further comprising a digital-to-analog converter (DAC) configured to generate the input signal based on the digital audio stream.

11. A method comprising:
    amplifying an input signal to generate a differential output signal;
    generating a second signal that corresponds to a time-convolution of an analog current signal and an analog voltage signal, wherein the analog current signal corresponds to a current at the differential output signal, and wherein the analog voltage signal corresponds to a voltage across the differential output signal; and
    subtracting the second signal from the input signal.

12. The method of claim 11, wherein at least one of the analog current signal or analog voltage signal is normalized with respect to the other analog signal.

13. The method of claim 11, further comprising generating the analog voltage signal by shifting a phase of the differential output signal.

14. The method of claim 11, further comprising at least partially compressing the second signal prior to subtracting the second signal from the input signal.

15. The method of claim 14, further comprising rendering the second signal null when the analog current signal is greater than the analog voltage signal.

16. The method of claim 14, further comprising iteratively varying a resistance in a path of the generated second signal based upon the subtracting second signal from the input signal.

17. An apparatus comprising:
    an audio amplifier having an audio input terminal and a differential output terminal;
    a current sense circuit coupled to the differential output terminal of the audio amplifier;

a voltage sense circuit coupled across the differential output terminal of the audio amplifier;

a first signal combiner circuit having a first input coupled to the current sense circuit and a second input coupled to the voltage sense circuit; and a second signal combiner circuit having a positive input coupled to the audio input terminal and a negative input coupled to an output of the first signal combiner circuit, the second signal combiner circuit having an output coupled to the audio input terminal of the audio amplifier.

18. The apparatus of claim 17, further comprising an analog filter having an input coupled to the output of the voltage sense circuit and an output coupled to the second input of the first signal combiner circuit.

19. The apparatus of claim 17, further comprising a compressor having an input coupled to the output of the first signal combiner circuit and an output coupled to the negative input of the second signal combiner circuit.

20. The apparatus of claim 19, wherein the compressor further comprises a variable resistor and a selection circuit.

21. The apparatus of claim 17, wherein the audio amplifier comprises a class D audio amplifier.

22. The apparatus of claim 17, further comprising:
a digital audio processing device; and
a loud speaker coupled to the differential output terminal of the audio amplifier.

23. The apparatus of claim 22, further comprising a digital-to-analog convert (DAC) having an input coupled to an output of the digital audio processing device and an output coupled to the audio input terminal of the audio amplifier.

* * * * *